(12) United States Patent
Yoshino

(10) Patent No.: US 11,058,006 B2
(45) Date of Patent: Jul. 6, 2021

(54) COMPONENT-EMBEDDED SUBSTRATE

(71) Applicant: SHINKO ELECTRIC INDUSTRIES CO., LTD., Nagano (JP)

(72) Inventor: Hirokazu Yoshino, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/838,228

(22) Filed: Apr. 2, 2020

(65) Prior Publication Data

US 2020/0329564 A1 Oct. 15, 2020

(30) Foreign Application Priority Data

Apr. 11, 2019 (JP) .............................. JP2019-075899

(51) Int. Cl.
| | |
|---|---|
| *H05K 1/18* | (2006.01) |
| *H05K 3/46* | (2006.01) |
| *H05K 1/11* | (2006.01) |
| *H05K 3/40* | (2006.01) |

(52) U.S. Cl.
CPC ............. *H05K 1/186* (2013.01); *H05K 1/115* (2013.01); *H05K 3/4007* (2013.01); *H05K 3/4644* (2013.01); *H05K 3/4697* (2013.01); *H05K 2201/10015* (2013.01); *H05K 2203/107* (2013.01)

(58) Field of Classification Search
CPC ...... H05K 1/0272; H05K 1/115; H05K 1/183; H05K 1/185; H05K 1/186; H05K 2201/09045; H05K 2201/10015; H05K 2201/09909; H05K 2203/107; H05K 3/303; H05K 3/305; H05K 3/4697; H05K 3/4644; H05K 3/4007; H05K 2201/0187; H05K 2201/0191
See application file for complete search history.

(56) References Cited

U.S. PATENT DOCUMENTS

| | | | | |
|---|---|---|---|---|
| 2002/0135063 | A1* | 9/2002 | Alcoe | H01L 23/16 257/734 |
| 2006/0003495 | A1 | 1/2006 | Sunohara et al. | |
| 2010/0301473 | A1* | 12/2010 | Sasaoka | H01L 29/66007 257/737 |
| 2012/0227261 | A1 | 9/2012 | Inui | |
| 2014/0144686 | A1 | 5/2014 | Shimizu | |
| 2014/0247561 | A1 | 9/2014 | Inui | |
| 2015/0250050 | A1* | 9/2015 | Lee | H05K 3/4682 361/761 |
| 2016/0007480 | A1* | 1/2016 | Yosui | H05K 3/4617 343/787 |

FOREIGN PATENT DOCUMENTS

| | | |
|---|---|---|
| JP | 2006-019441 | 1/2006 |
| JP | 2012-191204 | 10/2012 |
| JP | 2014-107431 | 6/2014 |
| JP | 2016-096170 | 5/2016 |

* cited by examiner

*Primary Examiner* — Roshn K Varghese
(74) *Attorney, Agent, or Firm* — Rankin, Hill & Clark LLP

(57) ABSTRACT

A component-embedded substrate includes: a buildup layer including an insulating resin layer and a conductor layer; a cavity that is formed in the buildup layer; an electronic component that is mounted on a bottom face of the cavity through an adhesive layer; a pedestal that is disposed on the bottom face of the cavity so as to be opposed to four corners of the electronic component; and a filling resin layer that is filled into the cavity to cover the electronic component and the pedestal.

9 Claims, 15 Drawing Sheets

COMPONENT-EMBEDDED SUBSTRATE

This application claims priority from Japanese Patent Applications No. 2019-075899, filed on Apr. 11, 2019, the entire contents of which are herein incorporated by reference.

BACKGROUND

Technical Field

The present disclosure relates to a component-embedded substrate.

Background Art

Recently, a component-embedded substrate in which, for example, a component such as a capacitor is embedded in a substrate has drawn attention in order to attain component mounting at a high density. The component-embedded substrate is manufactured in such a manner that, for example, a cavity is provided in the substrate in which layers each including an insulating buildup resin layer and a conductor layer are deposited on one another, and a buildup resin is filled into the cavity where the component has been disposed.

The component is bonded to one of the conductor layers inside the substrate, for example, by an adhesive material or the like. Specifically, the component is temporarily bonded to the conductor layer exposed in a bottom face of the cavity by the adhesive material which is in a semi-cured state, and the buildup resin is then filled into the cavity where the adhesive material remains in the semi-cured state. When the buildup resin is thermally cured, the adhesive material in the semi-cured state is simultaneously thermally cured. In this manner, the component embedded in the substrate is bonded to the conductor layer. Vias are formed in the buildup resin above the component so that the conductor layer for the component is connected to wirings on the surface of the substrate through the vias (see e.g., JP-A-2016-96170, JP-A-2006-019441, JP-A-2012-191204, and JP-A-2014-107431).

When the buildup resin is filled into the cavity, the component is pressed downward by the buildup resin filled above the component. Therefore, the adhesive material in the semi-cured state under the component is pushed out in all circumferential directions. On this occasion, when, for example, the component is shaped like a rectangular parallelepiped, the adhesive material flows only outward from each of the four sides of an outer periphery of a lower face of the component in the vicinity of the center of the side but flows outward radially from each of the four corners of the lower face of the component in the vicinity of the corner, and also flows outward from the two sides forming the corner. That is, a larger amount of the adhesive material is apt to flow outward from the vicinities of the four corners of the outer periphery of the lower face of the component. As a result, thickness of the adhesive material is thinner in the vicinities of the four corners of the outer periphery of the lower face of the component, so that the component is bonded in a state in which the component has been bent into a shape high in the vicinity of the center but low in the four corners.

In addition, when, for example, a thermal expansion coefficient of the adhesive material is larger than a thermal expansion coefficient of the component, the adhesive material contracts largely in a cooling process after the thermal curing. Thus, the bent state of the component is fostered.

When the component is bonded thus in the bent state, thickness of the buildup resin above the component may vary from place to place. That is, the buildup resin above the component tends to be thinner in the vicinity of the center of the component but tends to be thicker in the vicinities of the four corners of the component. When each of vias shaped like an inverted truncated cone is formed in the buildup resin above the component, the diameter of the bottom of the via varies depending on its position due to the variation of the thickness of the buildup resin. Specifically, the buildup resin above each of the vicinities of the four corners is thicker than that in the vicinity of the center of the component. Accordingly, each of the vias above the vicinities of the four corners may be deeper and the diameter of the bottom of the via may be therefore smaller. As a result, there is a problem that a connection area between a corresponding one of electrodes of the component and the via is reduced, thereby leading to deterioration in connection reliability between the component and a corresponding one of wirings through the via.

Further, since the buildup resin above the vicinity of the center of the component is thinner, there is another problem that a distance between each of the electrodes of the component and each of the wirings on the surface of the substrate is reduced, thereby leading to deterioration in insulation reliability therebetween.

SUMMARY

The present disclosure provides a component-embedded substrate in which connection reliability and insulation reliability between a component and wirings can be improved.

A certain embodiment provides a component-embedded substrate.

The component-embedded substrate comprises:
a buildup layer comprising an insulating resin layer and a conductor layer;
a cavity that is formed in the buildup layer;
an electronic component that is mounted on a bottom face of the cavity through an adhesive layer;
a pedestal that is disposed on the bottom face of the cavity so as to be opposed to four corners of the electronic component; and
a filling resin layer that is filled into the cavity to cover the electronic component and the pedestal.

DESCRIPTION OF EMBODIMENT

An embodiment of a component-embedded substrate and a method for manufacturing the component-embedded substrate disclosed by the present application will be described below in detail with reference to the drawings. Incidentally, the present disclosure is not limited by the embodiment.

Figure 1:
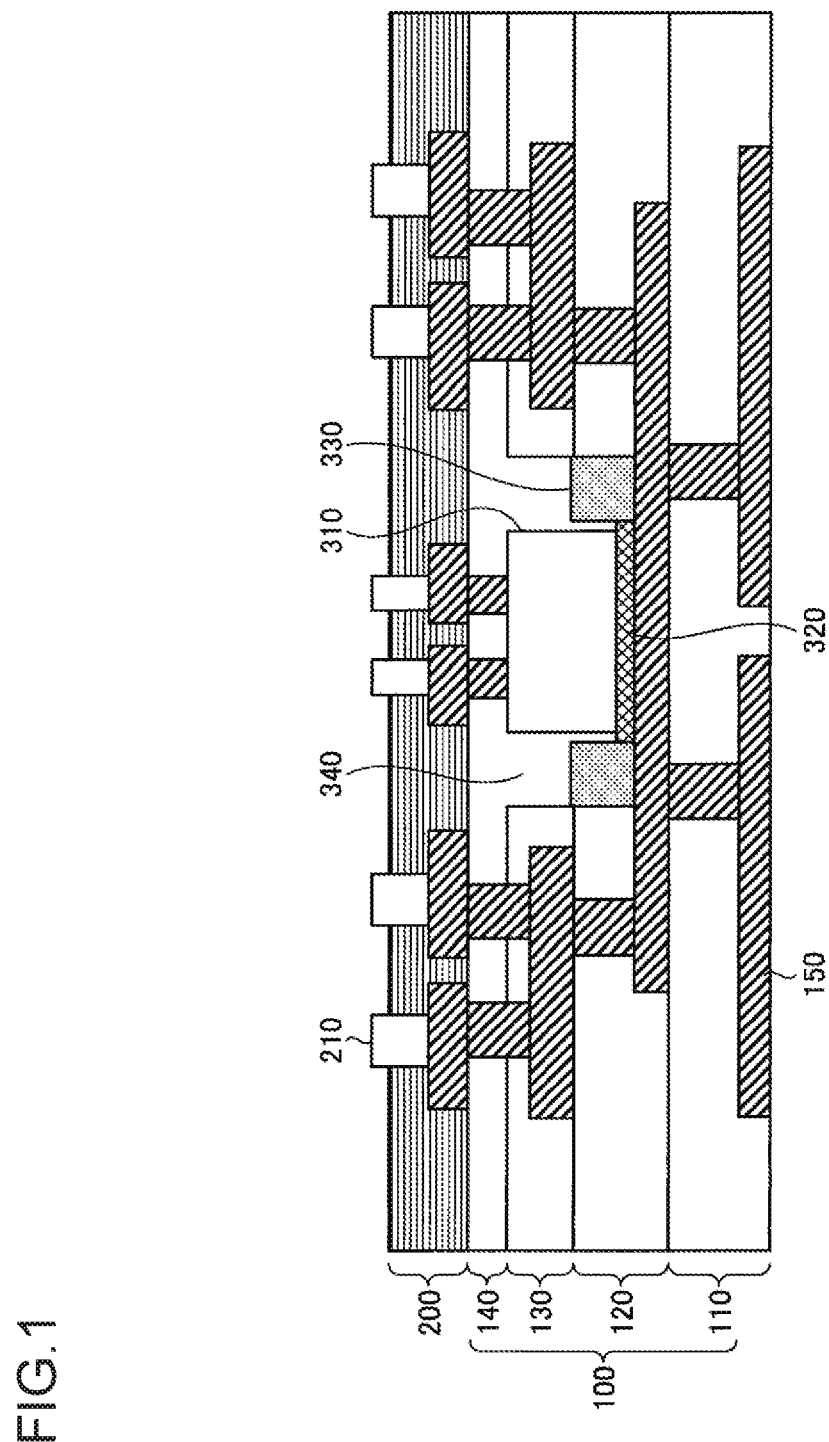
FIG. 1 is a view showing the configuration of a component-embedded substrate according to an embodiment.

FIG. 1 is a view showing the configuration of the component-embedded substrate according to the embodiment. In FIG. 1, a section of the component-embedded substrate is schematically shown.

The component-embedded substrate is formed into a layered structure which is roughly divided into a buildup layer 100 and a solder resist layer 200. A component 310 is buried in the buildup layer 100. The buildup layer 100 is further divided into a first layer 110, a second layer 120, a third layer 130 and a filling resin layer 140. A conductor layer 150 is included in each of the first layer 110, the second layer 120 and the third layer 130. The conductor layers 150 of adjacent ones of the layers are connected to each other through vias. In the following description, the first layer 110 is illustrated as a lowermost layer, and the solder resist layer 200 is illustrated as an uppermost layer, as shown in FIG. 1. For example, the component-embedded substrate may be used in a vertically inverted manner or may be used at any posture.

The first layer 110 is formed from an insulating buildup resin layer and the conductor layer 150. A buildup resin forming the first layer 110 is cured by thermal curing so as to retain the conductor layer 150 inside the first layer 110 at a predetermined position.

The second layer 120 is adjacently deposited on an upper side of the first layer 110. The second layer 120 is formed from an insulating buildup resin layer and the conductor layer 150. The buildup resin forming the second layer 120 is cured by thermal curing so as to retain the conductor layer 150 inside the second layer 120 at a predetermined position. The conductor layer 150 inside the second layer 120 is connected to the conductor layer 150 inside the first layer 110 through the vias.

The third layer 130 is adjacently deposited on an upper side of the second layer 120. The third layer 130 is formed from an insulating buildup resin layer and the conductor layer 150. The buildup resin forming the third layer 130 is cured by thermal curing so as to retain the conductor layer 150 inside the third layer 130 at a predetermined position. The conductor layer 150 inside the third layer 130 is connected to the conductor layer 150 inside the second layer 120 through the vias. The component 310 is buried in the second layer 120 and the third layer 130.

The filling resin layer 140 is a layer which is formed continuously to a filling resin 340 which will be filled into a cavity in a component burying step as will be described later. Wirings are laid on the surface of the filling resin layer 140. The wirings are covered with the solder resist layer 200. Vias are formed in the filling resin layer 140 after the component burying step. The conductor layer 150 inside the third layer 130 or electrodes of the component 310 are connected to the wirings on the surface of the filling resin layer 140. The resin forming the filling resin layer 140 may be a resin similar to or the same as the resin forming the buildup resin layers of the first layer 110 to the third layer 130.

The conductor layers 150 are, for example, formed from metal such as copper. Each of the conductor layers 150 is retained at a predetermined position by a corresponding one of the buildup resin layers of the layers. The conductor layers 150 of the layers adjacent to each other are electrically conductively connected to each other through the vias formed in each of the layers. In addition, the component 310 is bonded to the conductor layer 150 inside the second layer 120 by an adhesive material 320. Pedestals 330 inhibiting the adhesive material 320 from flowing outward from a lower face of the component 310 are formed on the conductor layer 150 around the component 310.

The solder resist layer 200 is a layer which covers the wirings disposed on the surface of the buildup layer 100 to protect the wirings. The solder resist layer 200 is formed as a coating film, for example, by pattern printing etc. For example, in a portion where an external component such as a semiconductor chip is mounted, openings are provided in the solder resist layer 200, and bumps 210 connected to the wirings on the surface of the buildup layer 100 are formed in the opening portions.

The component 310 is, for example, an electronic component such as a capacitor. The component 310 is buried in the second layer 120 and the third layer 130. That is, the filling resin 340 is filled around the component 310 so as to bury the component 310 in the buildup layer 100. The lower face of the component 310 is a bonding face bonded to the conductor layer 150 of the second layer 120 by the adhesive material 320.

For example, the component 310 has the shape of a rectangular parallelepiped. The pedestals 330 are formed around the lower face of the component 310. Specifically, the pedestals 330 each shaped like a rectangle in top view are placed around four corners of the lower face of the component 310. For example, the pedestals 330 are made of an insulating resin similar to or the same as that of the buildup resin layer. The pedestals 330 are placed on the conductor layer 150 of the second layer 120 to be buried together with the component 310. Height of each of the pedestals 330 is higher than thickness of the layer of the adhesive material 320, and lower than depth of the cavity which is formed in the second layer 120 and the third layer 130 in order to mount the component 310 in the cavity.

The pedestals 330 are placed around at least the four corners of the lower face of the component 310. Thus, even when the component 310 is pressed from above by the filling resin 340 filled into the cavity, the adhesive material 320 is restricted from flowing outward in the vicinities of the four corners of the lower face of the component 310. Thus, a difference in thickness of the adhesive material 320 between each of the vicinities of the centers of the four sides of the lower face of the component 310 and each of the vicinities of the four corners of the lower face can be reduced. As a result, bending of the component 310 bonded by the adhesive material 320 can be inhibited so as to make thickness of the buildup resin above the component 310 approximate to be uniform.

Thus, the pedestals 330 are placed around the component 310. Accordingly, the adhesive material 320 is restricted from flowing outward so that the component 310 is inhibited from bending. As a result, the thickness of the buildup resin above the component 310 approximates to be uniform. The diameters of the via bottoms of the vias formed in the buildup resin above the component 310 are equal to one another so that connection reliability of the vias can be improved. In addition, the thickness of the buildup resin is secured suitably so that insulation reliability can be improved.

Figure 2:
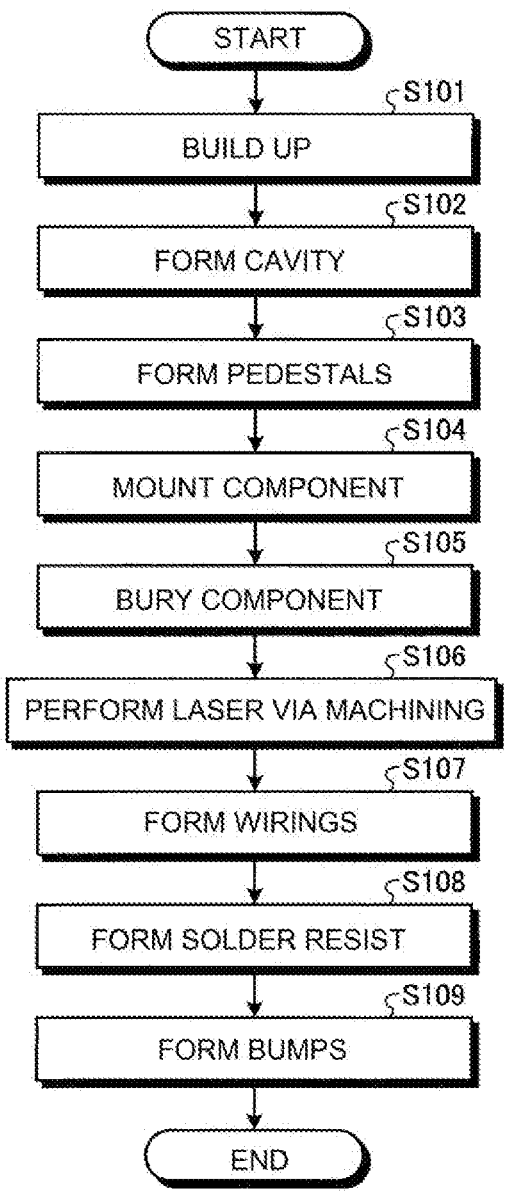
FIG. 2 is a flow chart showing a method for manufacturing the component-embedded substrate according to the embodiment.

Next, a specific example about the method for manufacturing the component-embedded substrate configured in the aforementioned manner will be described with reference of a flow chart of FIG. 2.

Figure 3:
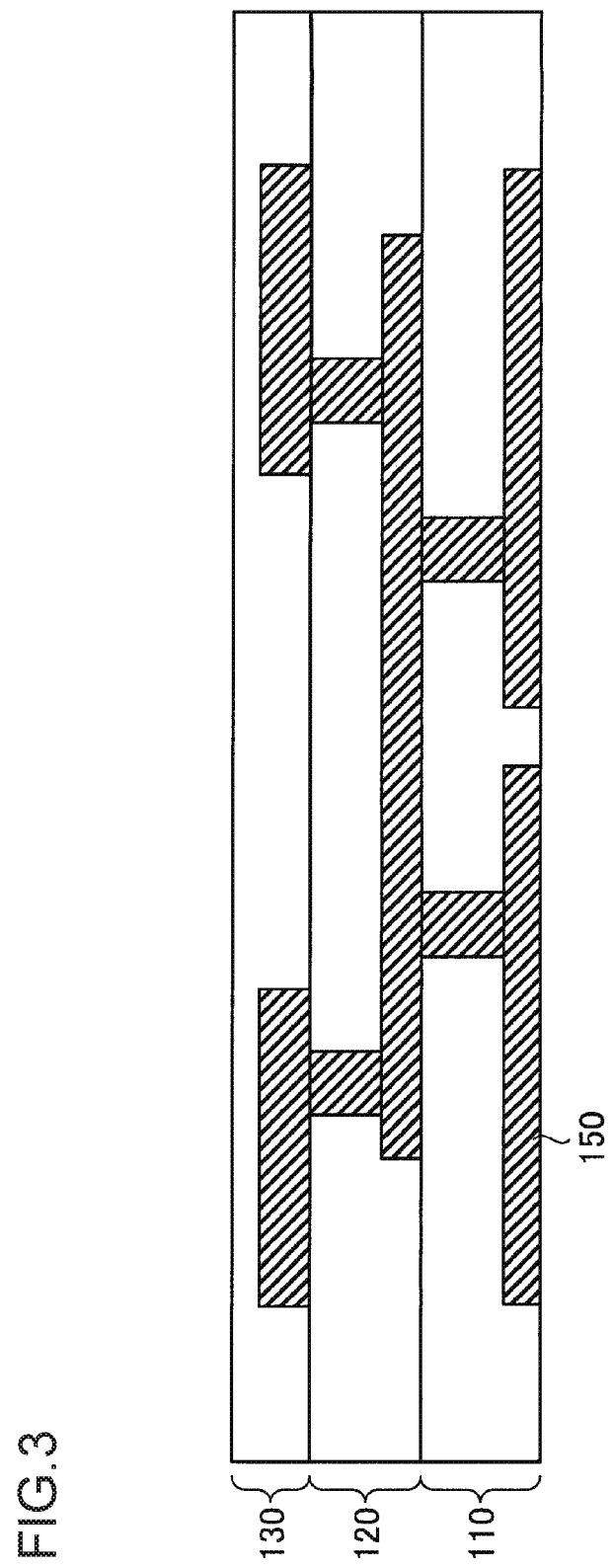
FIG. 3 is a view showing a specific example of a buildup step.

First, in a buildup step, a first layer 110 to a third layer 130 of a buildup layer 100 are deposited on one another (step S101). That is, for example, as shown in FIG. 3, the first layer 110 to the third layer 130 in each of which a conductor layer 150 is retained by a buildup resin layer are deposited on one another, and the conductor layers 150 of the layers are connected to one another through vias. On this occasion, no conductor layer 150 is disposed in a region where a component 310 is scheduled to be embedded. In the example of FIG. 3, the component 310 is scheduled to be embedded in the vicinity of the center of the second and third layers 120 and 130. Therefore, no conductor layer 150 is retained in this region.

Figure 4:
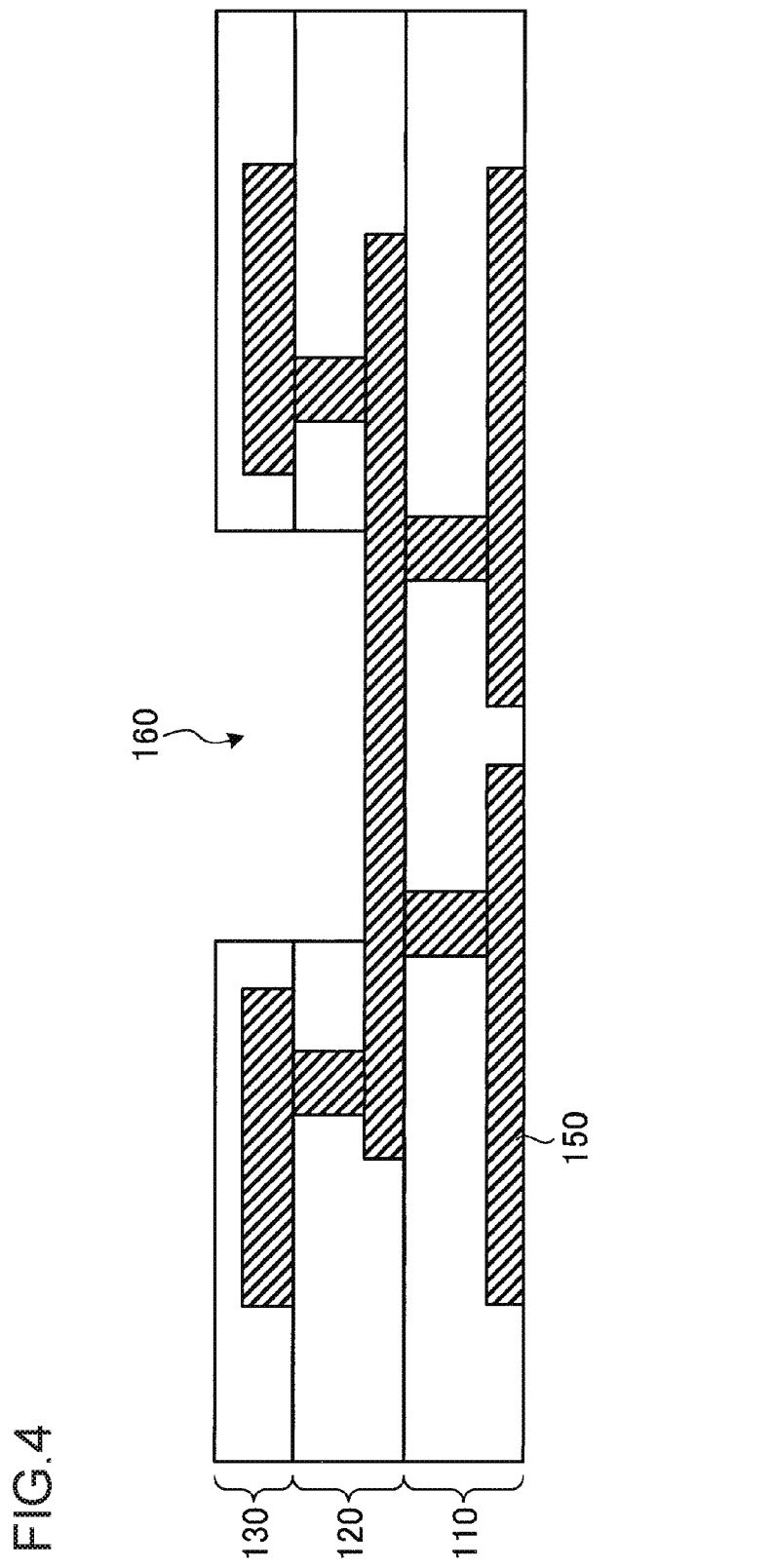
FIG. 4 is a view showing a specific example of a cavity forming step.

A cavity is formed in the region where the component is scheduled to be embedded (step S102). Specifically, for example, as shown in FIG. 4, the cavity 160 is formed by notching the buildup resin layers of the second and third layers 120 and 130. The cavity forming step can be carried out, for example, in such a manner that the buildup resin layers are spot-faced by a CO2 laser. The conductor layer 150 of the second layer 120 is exposed in a bottom face of the cavity 160. The cavity 160 is, for example, shaped like a rectangular parallelepiped large enough to accommodate the component 310. Accordingly, the rectangular shape of the bottom face of the cavity 160 is larger than the rectangular shape of a lower face of the component 310.

Figure 5:
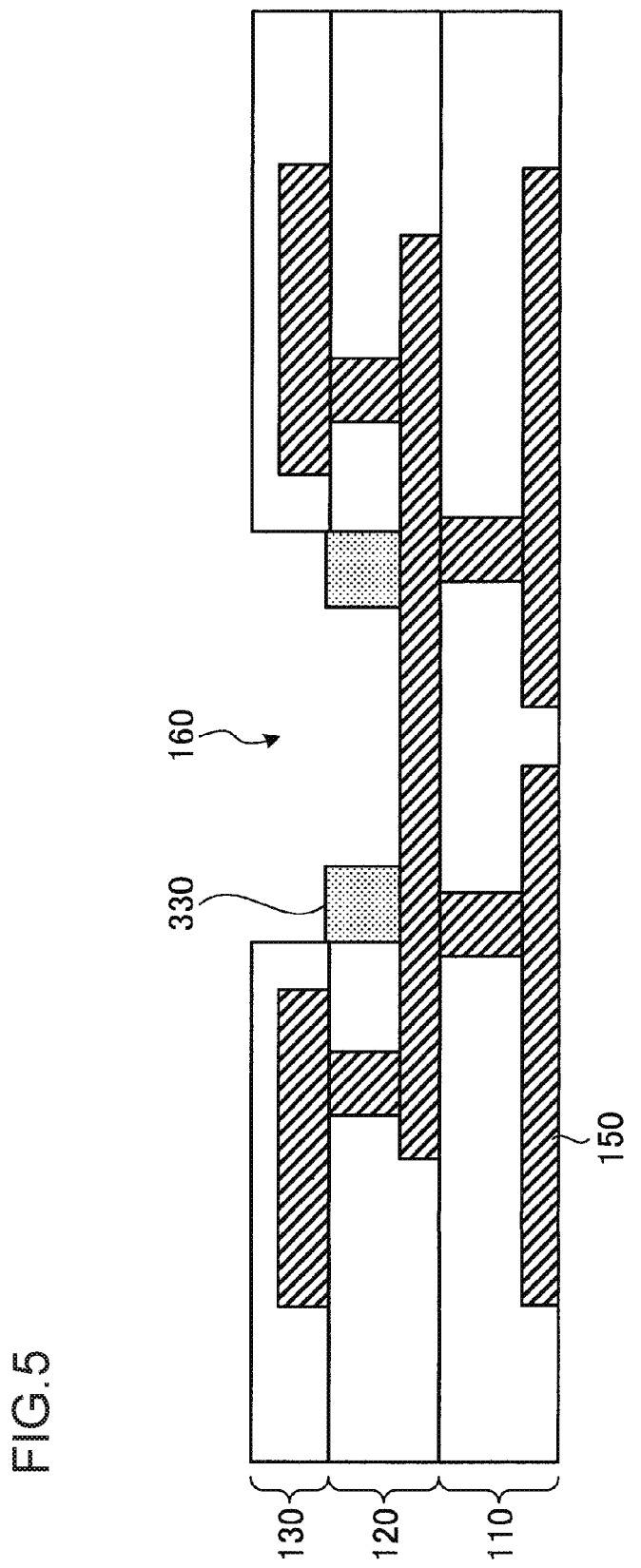
FIG. 5 is a view showing a specific example of a pedestal forming step.

Pedestals 330 are formed on the bottom face of the cavity 160 (step S103). Specifically, for example, as shown in FIG. 5, a non-photosensitive or photosensitive insulating resin is jetted onto circumferential edge portions of the cavity 160, for example, by a dispenser, an inkjet printer, or the like, and the jetted insulating resin is cured by heat, ultraviolet rays, or the like. Thus, the pedestals 330 are formed on the circumferential edge portions of the cavity 160. The insulating resin forming the pedestals 330 may be a resin similar to or the same as that of the buildup resin layers. In addition, height of the pedestals 330 is higher than thickness of a layer of an adhesive material 320 which will be used for bonding the component 310 later, and lower than depth of the cavity 160.

Since the height of the pedestals 330 is higher than the thickness of the layer of the adhesive material 320, the pedestals 330 can dam up the adhesive material 320 flowing outward from the lower face of the component 310. Accordingly, the pedestals 330 can restrict movement of the adhesive material 320. In addition, since the height of the pedestals 330 is lower than the depth of the cavity 160, the opening portion of the cavity 160 is not narrowed by the pedestals 330. Consequently, a filling resin 340 can be excellently filled into the cavity 160.

Figure 6:
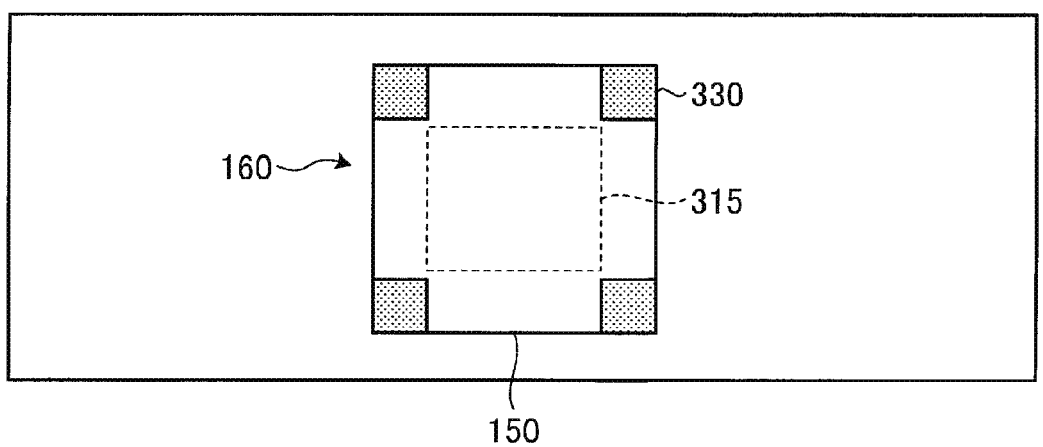
FIG. 6 is a view illustrating a pedestal layout.

Here, positions where the pedestals 330 are formed will be described with reference to FIG. 6. FIG. 6 is a plan view of the cavity 160 when seen from top. As shown in FIG. 6, the conductor layer 150 of the second layer 120 is exposed in the rectangular shape in the bottom face of the cavity 160, and a component mounting region 315 where the component 310 is scheduled to be mounted is provided in the center on the conductor layer 150. The pedestals 330 are formed on the circumferential edge portions of the cavity 160 not overlapping with the component mounting region 315. That is, the pedestals 330 are formed around, of the component mounting region 315 shaped like a rectangle, at least four corners of the component mounting region 315.

Figure 7:
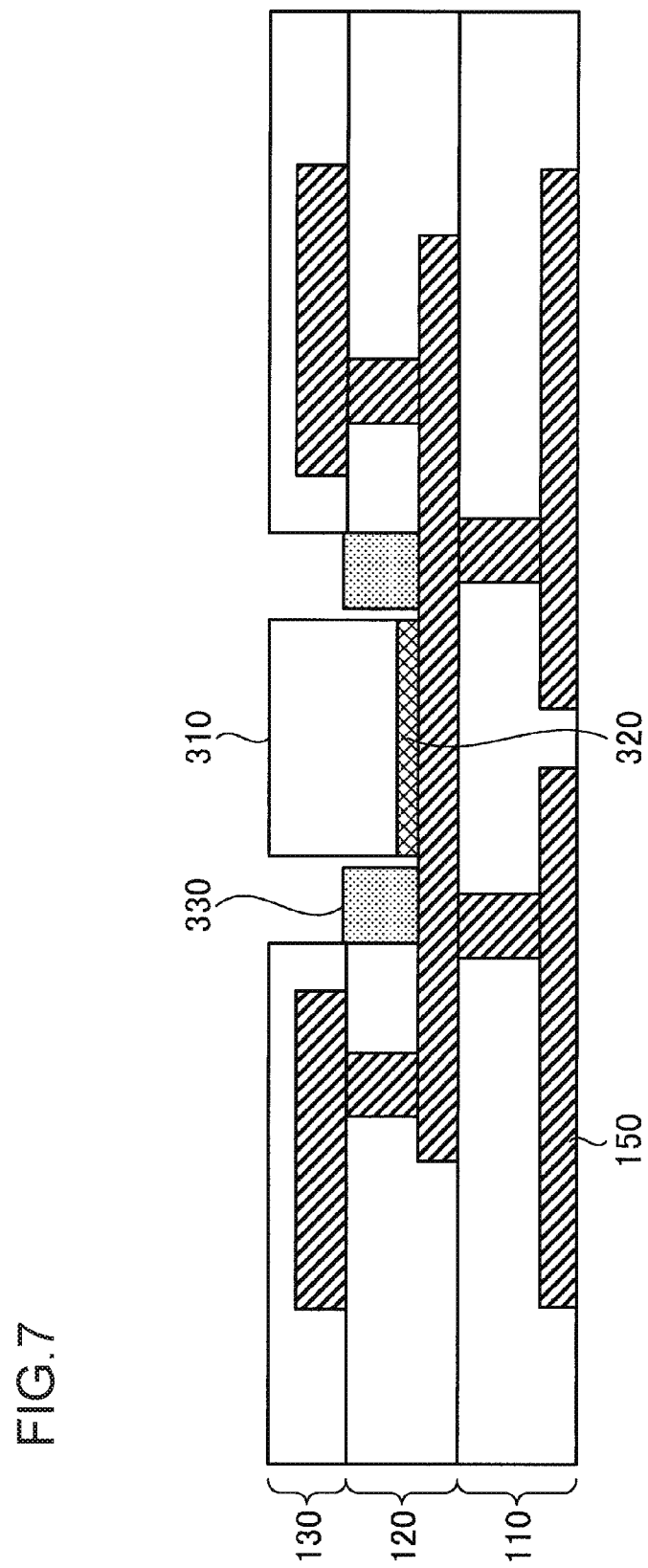
FIG. 7 is a view showing a specific example of a component mounting step.

The component 310 is mounted on the component mounting region 315 inside the cavity 160 (step S104). Specifically, for example, as shown in FIG. 7, the component 310 is temporarily bonded on the conductor layer 150 of the component mounting region 315 by the adhesive material 320. At this point of time, the adhesive material 320 is in a semi-cured state. Therefore, there is a possibility that the adhesive material 320 may be deformed and fluidized. Incidentally, as shown in FIG. 7, the thickness of the layer of the adhesive material 320 is thinner than the height of the pedestals 330.

The aforementioned sequence of the pedestal forming step (step S103) and the component mounting step (step S104) can be changed. That is, the pedestals 330 may be formed around the component 310 after the component 310 has been temporarily bonded inside the cavity 160.

Figure 8:
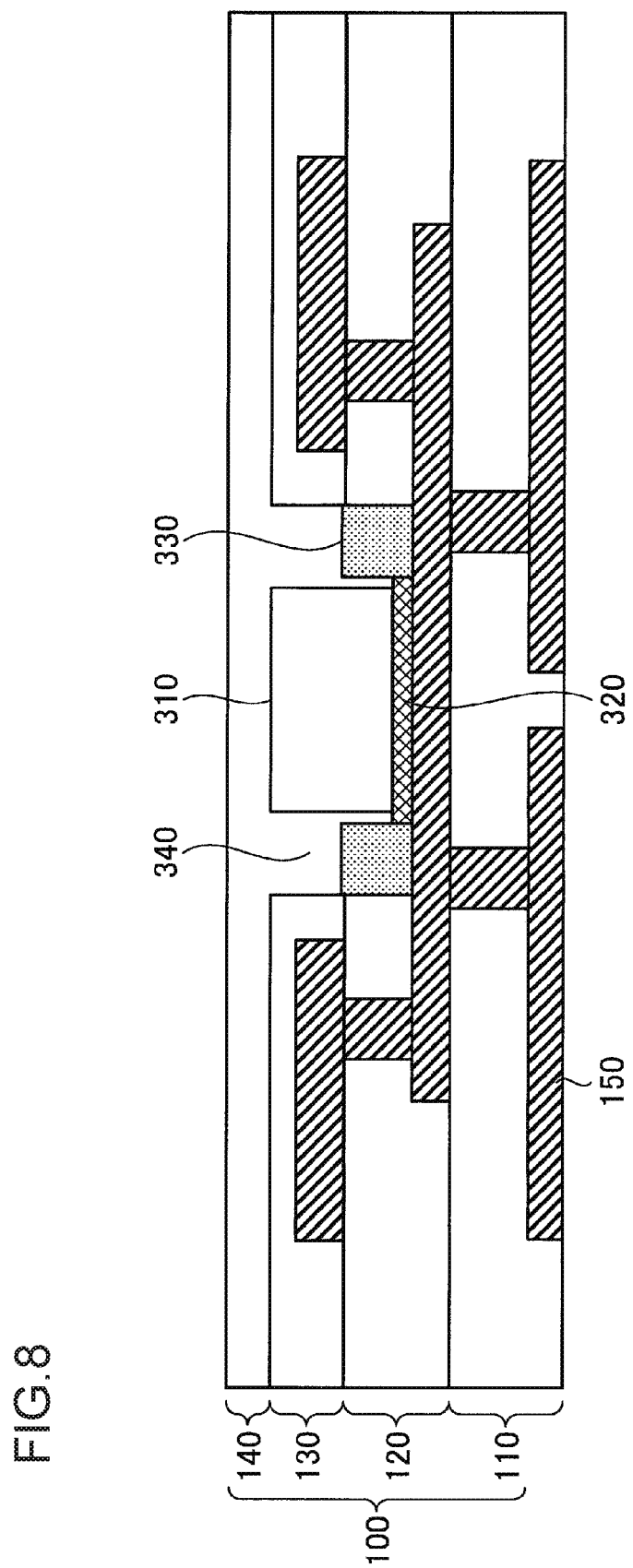
FIG. 8 is a view showing a specific example of a component burying step.

When the pedestals 330 are formed and the component 310 is mounted inside the cavity 160, the filling resin 340 is filled into the cavity 160 so as to bury the component 310 (step S105). That is, for example, as shown in FIG. 8, the space inside the cavity 160 is filled with the filling resin 340, and simultaneously, a filling resin layer 140 is formed to extend above the component 310. Thus, the component 310 is buried in the buildup layer 100 so that the component 310 is embedded in the substrate.

Figure 9:
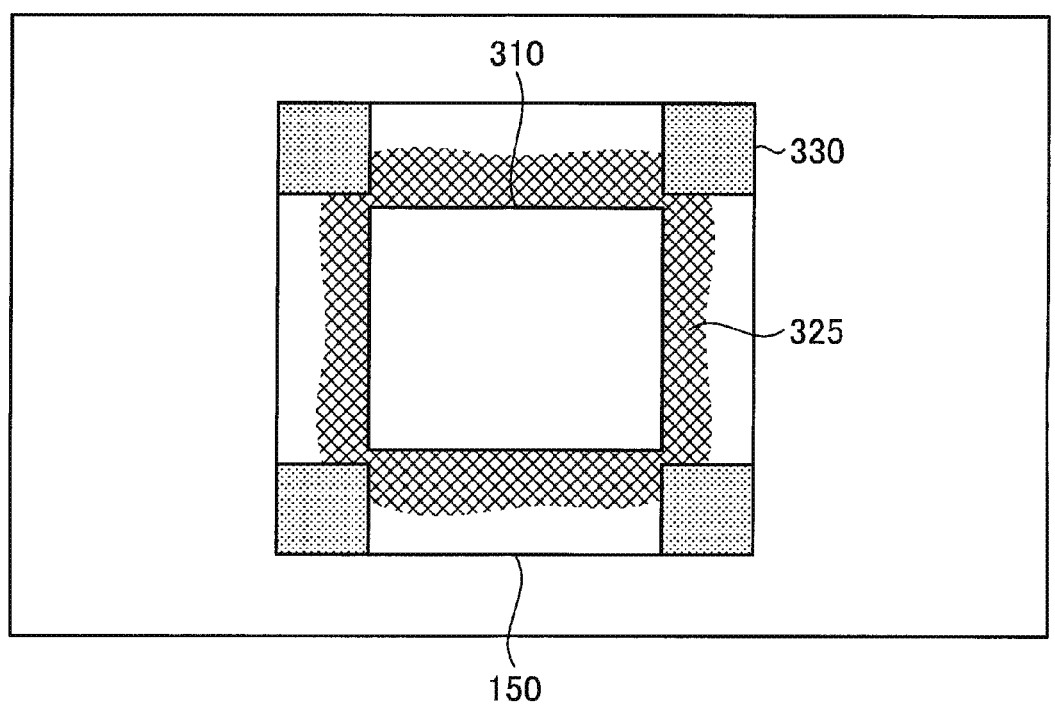
FIG. 9 is a view illustrating outflowing of an adhesive material.

At a stage where the filling resin 340 is filled and the filling resin layer 140 is formed, the component 310 is pressed by the resin above the component 310, and the adhesive material 320 in the semi-cured state flows outward from the lower face of the component 310. Specifically, for example, as shown in FIG. 9, the adhesive material 320 on circumferential edge portions of the component 310 moves outward due to pressure onto the component 310 so that an outflowing adhesive material 325 occurs in all circumferential directions of the component 310.

However, in the present embodiment, the pedestals 330 are formed around at least the four corners of the lower face of the component 310. Accordingly, a region where the outflowing adhesive material 325 can occur is limited. That is, vacant regions outside the four corners of the lower face of the component 310 are occupied by the pedestals 330. Accordingly, room to allow the adhesive material 320 to flow outward from the four corners of the lower face of the component 310 is reduced. Accordingly, the outflowing adhesive material 325 occurs only in a normal direction mainly from the four sides of an outer circumference of the lower face of the component 310 so that a large amount of the adhesive material 320 is restrained from flowing outward radially from the four corners. As a result, the amounts of the adhesive material 320 flowing outward from the vicinities of the centers of the four sides of the outer circumference of the lower face of the component 310 and the vicinities of the four corners of the outer circumference of the lower face of the component 310 are made equal. Thus, the thickness of the layer of the adhesive material 320 is uniform.

When the filling resin 340 is filled into the cavity 160 and the filling resin layer 140 is formed, the resins are thermally cured. Simultaneously, the adhesive material 320 under the component 310 is also thermally cured. On this occasion, the thickness of the layer of the adhesive material 320 is uniform. Accordingly, the component 310 does not bend even if the adhesive material 320 is thermally cured. In other words, flatness of the lower face and an upper face of the component 310 can be maintained so that the thickness of the buildup resin above the component 310 can be made uniform.

Figure 10:
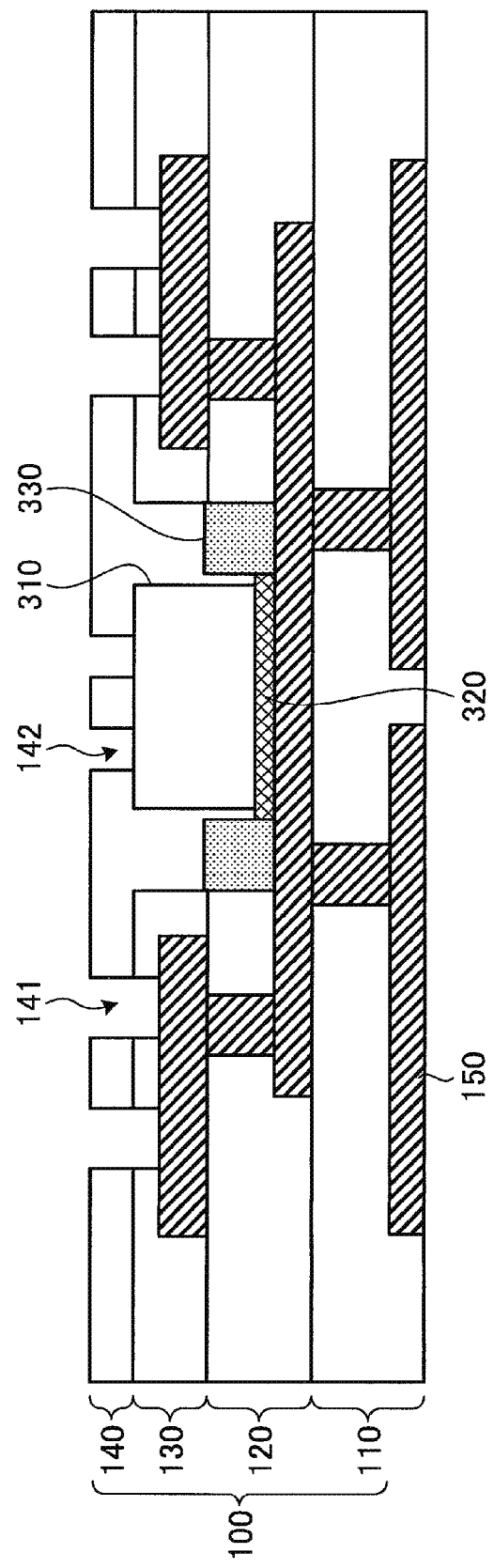
FIG. 10 is a view showing a specific example of a laser via machining step.

Vias for connecting the conductor layer 150 of the third layer 130 and electrodes of the component 310 to wirings on the surface of the substrate are formed (step S106). That is, for example, as shown in FIG. 10, vias 141 through which the surface of the buildup layer 100 is connected to the conductor layer 150 of the third layer 130, and vias 142 through which the surface of the buildup layer 100 is connected to the electrodes of the component 310 are formed, for example, by laser machining.

Each of the vias 141 and 142 is shaped like an inverted truncated cone approximating to a circular column. Accordingly, the diameter of the via 141, 142 in the surface of the buildup layer 100 is largest, and the diameter of the via 141, 142 in the via bottom is smallest. Since an upper face of the conductor layer 150 of the third layer 130 is flat, depth of the via 141 and the diameter of the via 141 in the via bottom are fixed regardless of the position of the via 141. In addition, in the present embodiment, the component 310 does not bend. Therefore, the upper face of the component 310 is flat. Depth of the via 142 and the diameter of the via 142 in the via bottom are also fixed regardless of the position of the via 142. Thus, an area of the via bottom making contact with a corresponding one of the electrodes of the component 310 is fixed so that connection reliability between the electrode of the component 310 and the via 142 can be improved.

Figure 11:
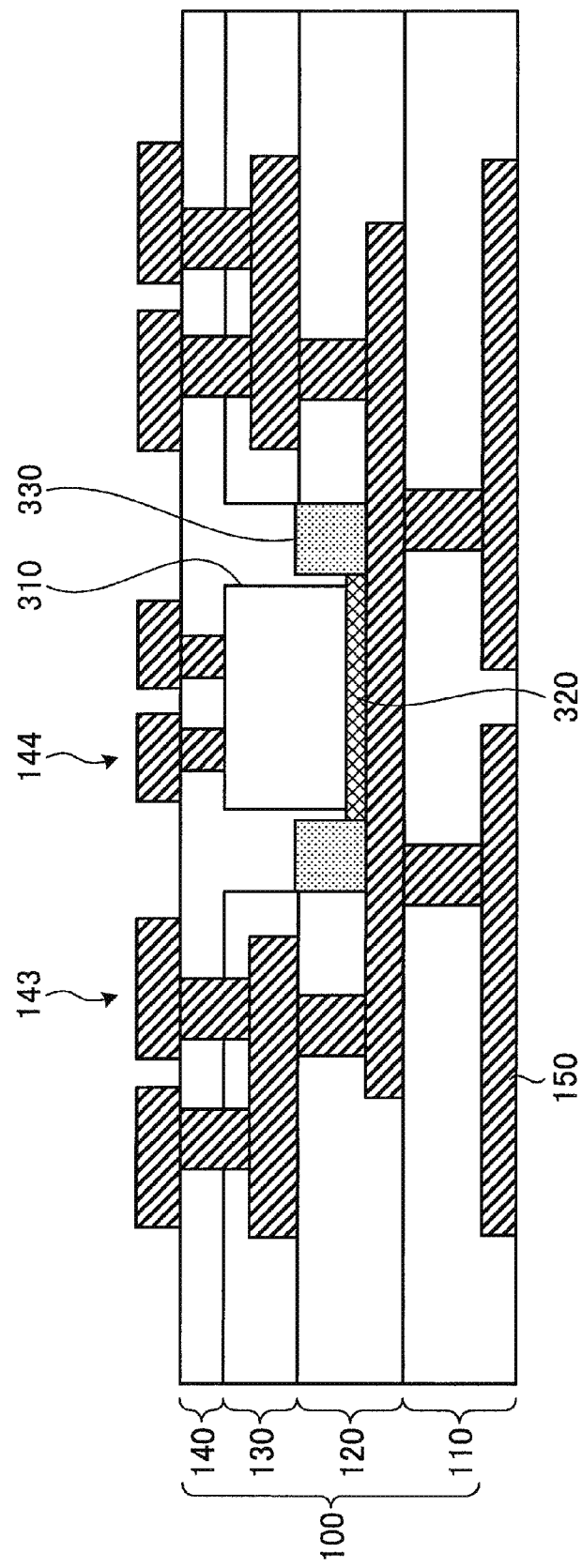
FIG. 11 is a view showing a specific example of a wiring forming step.

The wirings on the surface of the substrate are formed at the positions where the vias 141 and 142 have been formed (step S107). That is, for example, as shown in FIG. 11, wirings 143 are formed at the positions of the vias 141, and wirings 144 are formed at the positions of the vias 142. The wirings 143 and 144 are formed, for example, by SAP (Semi Additive Process). In the SAP, for example, a dry film resist is exposed to light and developed. However, in the present embodiment, the surface of the buildup layer 100 is flat so that accuracy of the exposure to light and the development can be made excellent. That is, in the present embodiment, the component 310 does not bend. Accordingly, the surface of the buildup layer 100 above the component 310 is also flat, and the wirings 144 can be formed finely.

The wirings 143 are connected to the conductor layer 150 of the third layer 130 through the vias 141, and the wirings 144 are connected to the electrodes of the component 310 through the vias 142. In the present embodiment, the component 310 does not bend. Accordingly, the thickness of the buildup resin above the component 310 can be uniform, and a fixed distance between each of the electrodes of the component 310 and each of the wirings 143 and 144 on the surface of the substrate can be secured. As a result, insulation reliability between the electrode of the component 310 and the wiring on the surface of the substrate can be improved.

Figure 12:
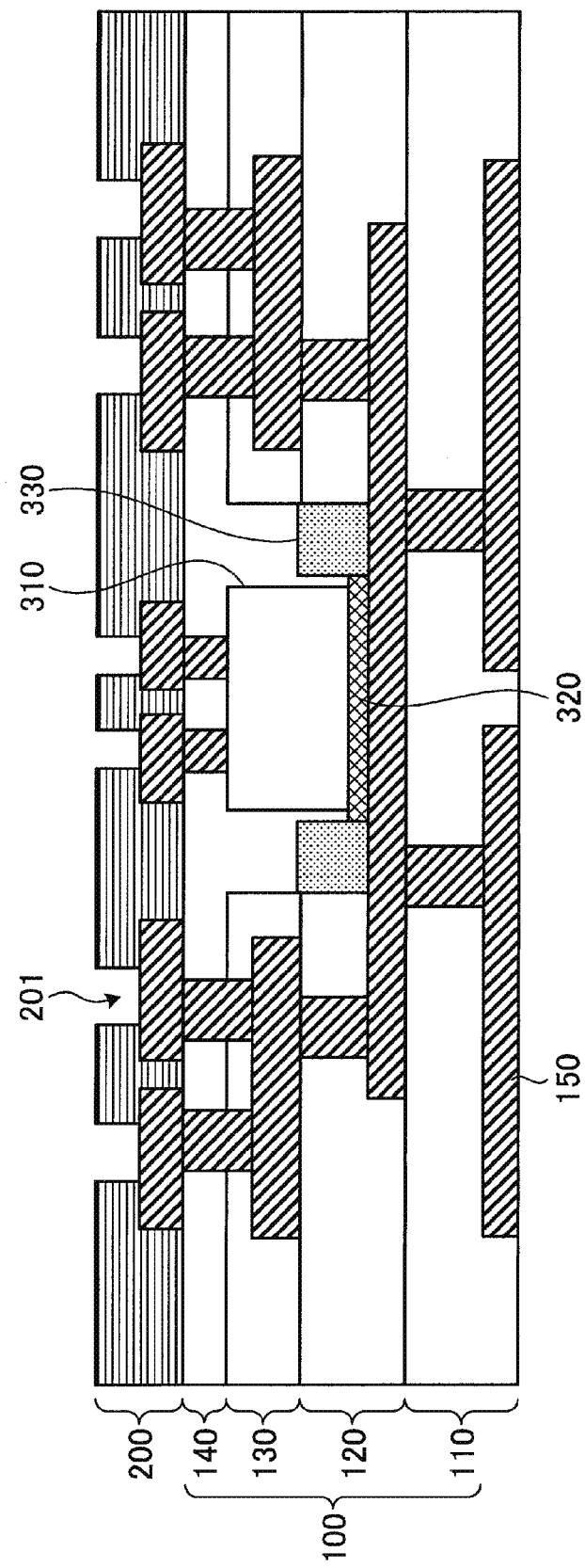
FIG. 12 is a view showing a specific example of a solder resist forming step.

A solder resist layer 200 is formed (step S108) so as to cover the wirings 143 and 144 on the surface of the substrate. The solder resist layer 200 is formed as a coating film, for example, by pattern printing etc. of an insulating resin. For example, as shown in FIG. 12, openings 201 are provided in the solder resist layer 200 at the positions corresponding to the wirings 143 and 144 on the surface of the substrate. The openings 201 are formed, for example, by photolithography, by use of a laser, or the like. For example, an external component such as a semiconductor chip is disposed on the positions of the openings 201.

Then, bumps 210 are formed in the openings 201 by plating, solder balls, or the like (step S109). The bumps 210 serve as contact points between the wirings 143 and 144 on the surface of the substrate and the external component.

According to the present embodiment as described above, the cavity is formed in the buildup layer in which the layers are deposited on one another, and the component is temporarily bonded to the bottom face of the cavity by the adhesive material. In addition, the pedestals are formed around at least the four corners of the lower face of the component. After the resin is filled into the cavity to bury the component and the pedestals, the adhesive material is thermally cured together with the filled resin. Therefore, even when the resin above the component is pressed downward during the filling, the adhesive material is restricted from flowing outward from the lower face of the component by the pedestals so that the thickness of the layer of the adhesive material under the component is uniform. Thus, when the adhesive material is thermally cured, the component does not bend so that the thickness of the buildup resin above the component is uniform. As a result, the depths of the vias formed above the component are equal to one another. Accordingly, the diameters of the via bottoms are fixed so that connection reliability by the vias can be improved. In addition, the distance between each of the electrodes of the component and each of the wirings on the surface of the substrate is fixed so that insulating reliability therebetween can be improved.

Figure 13:
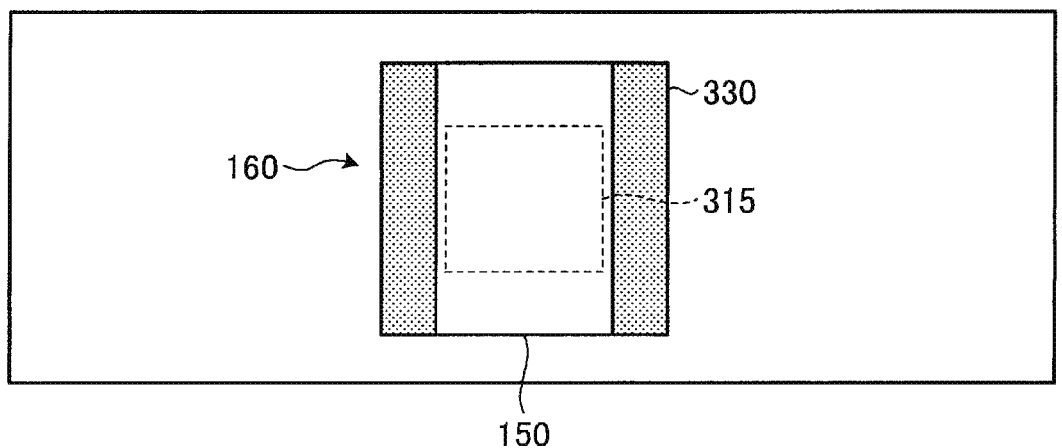
FIG. 13 is a view showing an example of the pedestal layout.
Figure 14:
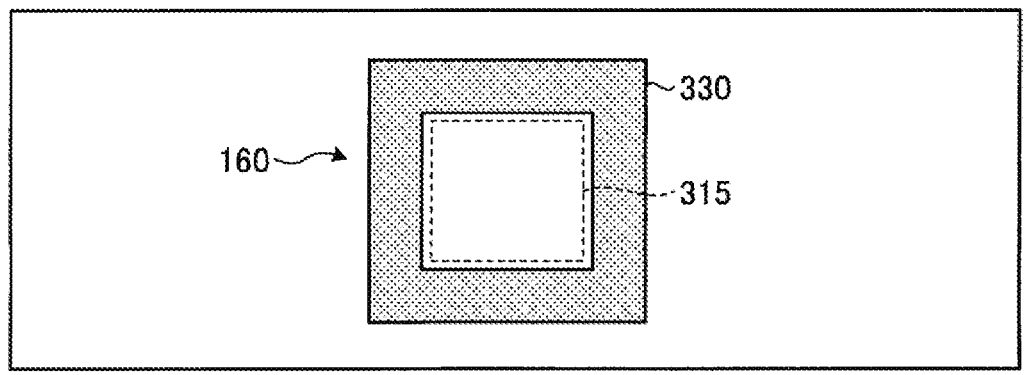
FIG. 14 is a view showing another example of the pedestal layout.
Figure 15:
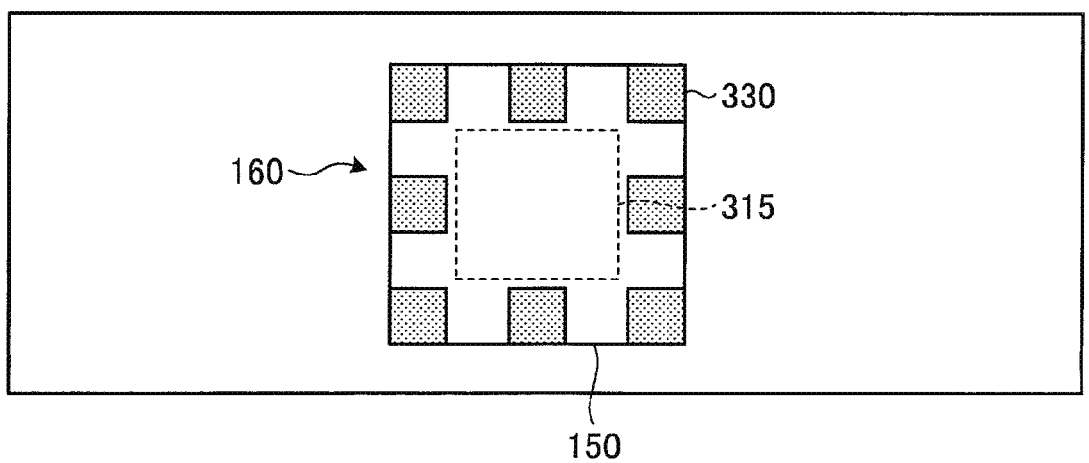
FIG. 15 is a view showing a further example of the pedestal layout.

Incidentally, although the pedestals 330 are disposed around the four corners of the lower face of the component 310 in the aforementioned embodiment, the pedestals may be however disposed at other positions. For example, as shown in FIG. 13, pedestals 330 may be disposed along two opposite sides of the component mounting region 350. In addition, for example, as shown in FIG. 14, a pedestal 330 may be disposed along each of the sides at a position surrounding the outer circumference of the component mounting region 315. Further, for example, as shown in FIG. 15, pedestals 330 may be disposed to be opposed to the vicinities of the centers of the sides of the component mounting region 315. In any of these cases, the pedestal or pedestals 330 are disposed around at least the four corners of the lower face of the component 310. Also in any of these cases, the adhesive material 320 can be restricted from flowing outward to the surroundings from the four corners of the lower face of the component 310. Accordingly, an effect similar to or the same as that in the aforementioned embodiment can be obtained.

In addition, although the component 310 is described as the shape of a rectangular parallelepiped in the aforementioned embodiment, the shape of the component is however not limited to the rectangular parallelepiped. Even when the shape of the component is not the rectangular parallelepiped, the pedestals can be disposed around at least the corners of the lower face of the component. Thus, the adhesive material can be restricted from flowing outward to the surroundings from the corners of the lower face of the component which is the bonding face. Accordingly, the effect similar to or the same as that in the aforementioned embodiment can be obtained.

Figure 16:
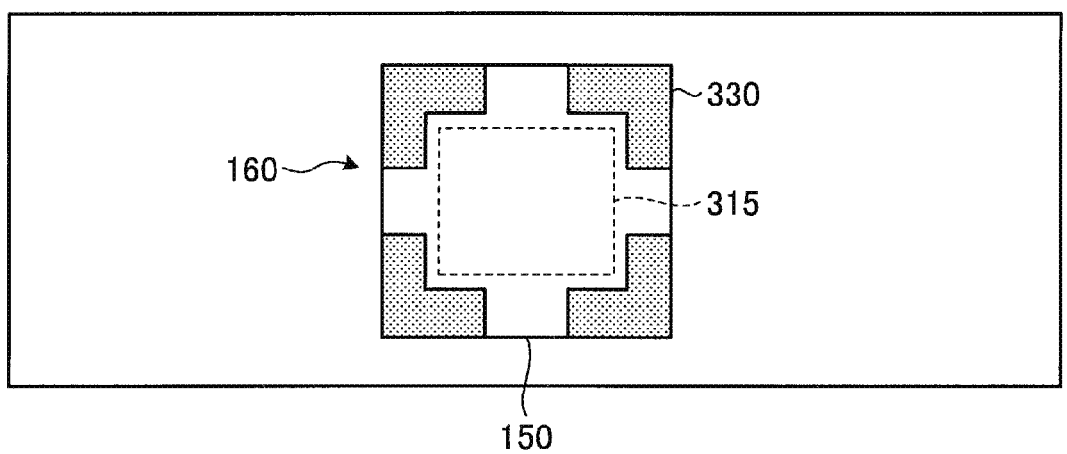
FIG. 16 is a view showing an example of the shape of each pedestal.
Figure 17:
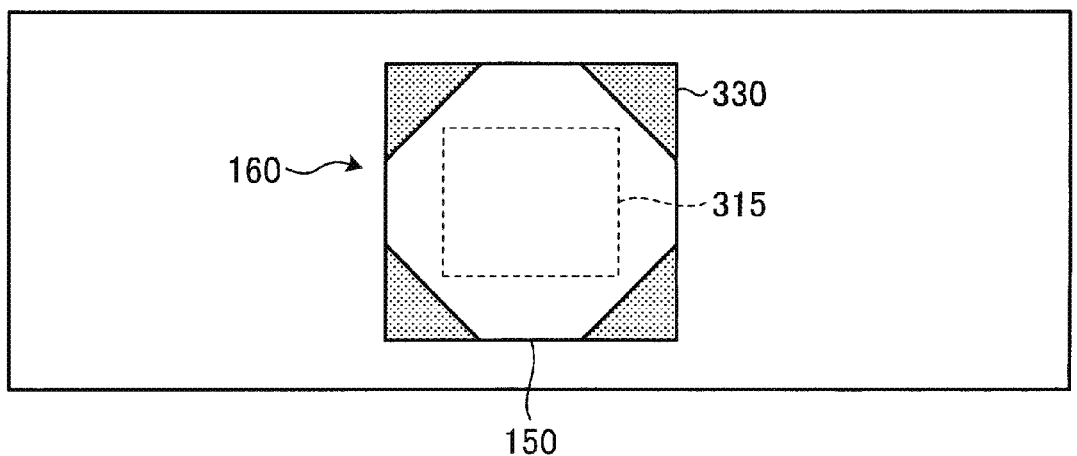
FIG. 17 is a view showing another example of the shape of the pedestal.

Further, in a similar manner to or the same manner as the component, the shape of each pedestal is also not limited to the rectangular parallelepiped. Specifically, for example, as shown in FIG. 16, pedestals 330 each of which is opposed to two sides forming a corresponding one of the corners of the component mounting region 315, and each of which is substantially L-shaped in top view may be disposed around the corners of the component mounting region 315. In addition, for example, as shown in FIG. 17, pedestals 330 each of which has a side opposed to one of the corners of the component mounting region 315, and each of which is shaped like a triangle in top view may be disposed around the corners of the component mounting region 315. Also by the pedestal or pedestals 330 having any of the aforementioned shapes, the adhesive material 320 can be restricted from flowing outward to the surroundings from the four corners of the lower face of the component 310. Accordingly, the effect similar to or the same as that in the aforementioned embodiment can be obtained.

Although the conductor layer 150 having the component mounting region 315 positioned in the bottom face of the cavity 160 is connected to another conductor layer 150 through the vias in the aforementioned embodiment, the present disclosure is however not limited thereto. For example, the conductor layer 150 having the component mounting region 315 may be a floating island which is not connected to the other conductor layer 150.

In addition, in the present embodiment, the bottom face of the cavity 160 is not limited to the surface of the conductor layer 150 exposed from the cavity 160. For example, when the conductor layer 150 is not formed in the second layer 120, the insulating resin layer of the second layer 120 of the buildup layer 100 may correspond to the bottom face of the cavity 160.

In addition, in the aforementioned embodiment, the adhesive material 320 is thermally cured together with the filling resin 340 after the component 310 has been mounted inside the cavity 160 and the filling resin 340 has been filled into the cavity 160. However, the adhesive material 320 may be thermally cured at an earlier stage. That is, for example, at a stage before the filling resin 340 is filled after the component 310 has been temporarily bonded, the adhesive material 320 may be thermally cured while the component 310 is pressed. Also in this case, the adhesive material 320 is restricted from flowing outward to the surroundings from the four corners of the lower face of the component 310 when the component 310 is pressed. Accordingly, the effect similar to or the same as that in the aforementioned embodiment can be obtained.

Various aspects of the subject matter described herein are set out non-exhaustively in the following numbered clauses:

1) A method for manufacturing a component-embedded substrate, the method comprising:
forming a buildup layer comprising an insulating resin layer and a conductor layer;
forming a cavity in the buildup layer;
disposing an electronic component on a bottom face of the cavity through an adhesive material;
forming a pedestal on the bottom face of the cavity so as to be opposed to four corners of the electronic component;
filling an insulating resin into the cavity so as to cover the electronic component and the pedestal; and
curing the insulating resin.

2) The method substrate according to Clause (1), wherein:
the bottom face of the cavity is a surface of the conductor layer exposed from the cavity.

What is claimed is:
1. A component-embedded substrate comprising:
a buildup layer comprising an insulating resin layer and a conductor layer;
a cavity that is formed in the buildup layer;
an electronic component that is mounted on a bottom face of the cavity through an adhesive layer;
a pedestal that is disposed on the bottom face of the cavity so as to be opposed to four corners of the electronic component; and
a filling resin layer that is filled into the cavity to cover the electronic component and the pedestal,
wherein a thickness of the pedestal is larger than a thickness of the adhesive layer, and the thickness of the pedestal is smaller than a depth of the cavity, and
wherein an entirety of the pedestal is housed within the cavity when the component-embedded substrate is viewed in plan view, and the filling resin covers an entirety of an upper surface of the pedestal, the upper surface of the pedestal being opposite to a lower surface of the pedestal which faces the bottom face of the cavity.

2. The component-embedded substrate according to claim 1, wherein:
the bottom face of the cavity is a surface of the conductor layer exposed from the cavity.

3. The component-embedded substrate according to claim 1, wherein:
the electronic component has a first side face and a second face that is opposite to the first side face; and
the pedestal is disposed on the bottom face of the cavity so as to be opposed to the first side face and the second side face.

4. The component-embedded substrate according to claim 1, wherein:
the pedestal is disposed on the bottom face of the cavity so as to completely surround the electronic component.

5. The component-embedded substrate according to claim 1, wherein:
the pedestal comprises:
a first pedestal portion that is opposed to a first corner portion of the electronic component,
a second pedestal portion that is opposed to a second corner portion of the electronic component,
a third pedestal portion that is opposed to a third corner portion of the electronic component, and
a fourth pedestal portion that is opposed to a fourth corner portion of the electronic component; and
each of the first pedestal portion, the second pedestal portion, the third pedestal portion and the fourth pedestal portions is formed into a rectangular shape in plan view.

6. The component-embedded substrate according to claim 1, wherein:
the electronic component comprises:
a first side face,
a second side face that is opposite to the first side face,
a third side face that is positioned between the first side face and the second side face, and
a fourth side face that is opposite to the third side face;
the pedestal comprises:
a first pedestal portion that is opposed to the first side face and the third side face, a second pedestal portion that is opposed to the first side face and the fourth side face, a third pedestal portion that is opposed to the second side face and the third side face, and a fourth pedestal portion that is opposed to the second side face and the fourth side face; and each of the first pedestal portion, the second pedestal portion, the third pedestal portion and the fourth pedestal portions is substantially formed into an L shape in plan view.

7. The component-embedded substrate according to claim 1, wherein:

the pedestal is formed of an insulating resin material and formed as a member separate from the buildup layer.

8. The component-embedded substrate according to claim 1, wherein:

a side wall of the cavity is defined by the insulating resin layer, and the bottom face of the cavity is a surface of the conductor layer exposed from the cavity; and the side wall of the cavity and the bottom face of the cavity are continuously connected to each other.

9. A component-embedded substrate comprising:

a buildup layer comprising an insulating resin layer and a conductor layer;

a cavity that is formed in the buildup layer;

an electronic component that is mounted on a bottom face of the cavity through an adhesive layer;

a pedestal that is disposed on the bottom face of the cavity so as to be opposed to four corners of the electronic component; and a filling resin layer that is filled into the cavity to cover the electronic component and the pedestal, wherein:

the pedestal comprises:

a first pedestal portion that is opposed to a first corner portion of the electronic component, a second pedestal portion that is opposed to a second corner portion of the electronic component, a third pedestal portion that is opposed to a third corner portion of the electronic component, and a fourth pedestal portion that is opposed to a fourth corner portion of the electronic component; and each of the first pedestal portion, the second pedestal portion, the third pedestal portion and the fourth pedestal portions is formed into a triangular shape in plan view.

* * * * *